(12) United States Patent
Kudou et al.

(10) Patent No.: US 10,390,437 B2
(45) Date of Patent: Aug. 20, 2019

(54) METHOD FOR MANUFACTURING WIRING CIRCUIT COMPONENT, MOLD FOR MANUFACTURING WIRING CIRCUIT COMPONENT, AND RESINOUS WIRING CIRCUIT COMPONENT

(71) Applicant: Koto Engraving Co., Ltd., Tokyo (JP)

(72) Inventors: Takumi Kudou, Tokyo (JP); Isamu Sakayori, Tokyo (JP)

(73) Assignee: KOTO ENGRAVING CO., LTD., Tokyo (JP)

( * ) Notice: Subject to any disclaimer, the term of this patent is extended or adjusted under 35 U.S.C. 154(b) by 43 days.

(21) Appl. No.: 15/501,594

(22) PCT Filed: Aug. 4, 2015

(86) PCT No.: PCT/JP2015/072147
§ 371 (c)(1),
(2) Date: Feb. 3, 2017

(87) PCT Pub. No.: WO2016/021618
PCT Pub. Date: Feb. 11, 2016

(65) Prior Publication Data
US 2017/0231096 A1 Aug. 10, 2017

(30) Foreign Application Priority Data
Aug. 5, 2014 (JP) ................................ 2014-159877

(51) Int. Cl.
*H05K 3/00* (2006.01)
*H05K 1/02* (2006.01)
(Continued)

(52) U.S. Cl.
CPC ....... *H05K 3/0014* (2013.01); *B29C 45/0053* (2013.01); *B29C 45/1635* (2013.01);
(Continued)

(58) Field of Classification Search
CPC ............ B29C 45/1635; B29C 45/1615; B29C 45/2602; B29C 45/0053; B29C 45/2628; H05K 3/0014
See application file for complete search history.

(56) References Cited

U.S. PATENT DOCUMENTS 3,807,920 A * 4/1974 Aoki ..................... B29C 45/062
264/245
4,073,854 A * 2/1978 Burry .................. B29C 45/0416
264/161
(Continued)

FOREIGN PATENT DOCUMENTS

DE   10 2010 064 351 A1   3/2012
JP   3-104614   5/1991
(Continued)

OTHER PUBLICATIONS

Japanese Official Action—2016-540254—dated Nov. 22, 2017.
(Continued)

*Primary Examiner* — Joseph S Del Sole
*Assistant Examiner* — Emmanuel S Luk
(74) *Attorney, Agent, or Firm* — Young & Thompson

(57) ABSTRACT

A one-surface groove for wiring is formed in a front surface 2*a*, opposite-surface grooves for wiring are formed in a back surface 2*b* by protruding core members, and communication parts for allowing the one-surface groove and the opposite-surface grooves to communicate with each other are formed to shape a board section 2 made of a non-conductive resin. After the core members are retracted, a conduction-side resin, which will become conductive, is shaped in the one-surface groove, the opposite-surface grooves, and the communication parts to form front-side wiring 3, communication wirings 4, and back-side wirings 5, whereby a wiring circuit component is provided.

2 Claims, 8 Drawing Sheets

(51) Int. Cl.
*H05K 1/03* (2006.01)
*B29C 45/00* (2006.01)
*B29C 45/26* (2006.01)
*B29C 45/16* (2006.01)
B29K 55/02 (2006.01)
B29K 69/00 (2006.01)
H05K 3/42 (2006.01)
B29L 31/34 (2006.01)

(52) U.S. Cl.
CPC ....... *B29C 45/2628* (2013.01); *H05K 1/0213* (2013.01); *H05K 1/0353* (2013.01); *B29C 45/1615* (2013.01); *B29C 45/2602* (2013.01); *B29K 2055/02* (2013.01); *B29K 2069/00* (2013.01); *B29K 2995/0005* (2013.01); *B29K 2995/0007* (2013.01); *B29K 2995/0011* (2013.01); *B29L 2031/3425* (2013.01); *H05K 3/426* (2013.01); *H05K 2201/09118* (2013.01)

(56) References Cited

U.S. PATENT DOCUMENTS

| | | | | |
|---|---|---|---|---|
| 4,416,602 A * | 11/1983 | Neumeister | ............ | B29C 45/062 264/328.7 |
| 4,822,550 A * | 4/1989 | Komathu | .......... | B29C 45/14655 257/E21.504 |
| 4,954,308 A * | 9/1990 | Yabe | ................. | B29C 45/14647 257/E21.504 |
| 5,007,822 A * | 4/1991 | Hara | ................... | B29C 45/0416 425/575 |
| 5,252,280 A * | 10/1993 | Motisi | ..................... | B29C 45/26 249/102 |
| 5,295,802 A * | 3/1994 | Hersbt | .................... | B29C 45/42 249/67 |
| 5,756,029 A * | 5/1998 | Nakamichi | ............. | B29C 45/16 264/161 |
| 5,798,073 A * | 8/1998 | Johnson | ............. | B29C 33/0033 249/154 |
| 5,882,553 A * | 3/1999 | Prophet | ................. | B29C 45/062 264/1.7 |
| 6,086,355 A * | 7/2000 | Rozema | ............. | B29C 45/4005 425/441 |
| 6,451,238 B1 * | 9/2002 | Suzuki | ............... | B29C 45/0416 264/250 |
| 6,921,258 B1 * | 7/2005 | Schmidt | ............. | B29C 45/4005 425/444 |
| 2002/0051830 A1 * | 5/2002 | Takikawa | ............ | B29C 45/062 425/112 |
| 2003/0116886 A1 * | 6/2003 | Nakazawa | ............ | B29C 45/062 264/255 |
| 2004/0094866 A1 * | 5/2004 | Boucherie | ........... | B29C 45/0416 264/255 |
| 2006/0151911 A1 * | 7/2006 | Zollner | ............... | B29C 37/0028 264/255 |
| 2006/0186575 A1 * | 8/2006 | Prskalo | ................. | B29C 43/021 264/255 |
| 2007/0252305 A1 * | 11/2007 | Kuo | .................... | B29C 37/0082 264/255 |
| 2008/0179793 A1 * | 7/2008 | Schad | ................. | B29C 45/4005 264/334 |
| 2014/0239544 A1 * | 8/2014 | Franksson | ............. | B29C 45/162 264/255 |
| 2015/0298376 A1 * | 10/2015 | Tozawa | ............... | B29C 45/1615 264/39 |
| 2016/0107358 A1 * | 4/2016 | Komiya | ................ | B29C 45/762 425/163 |

FOREIGN PATENT DOCUMENTS

| | | |
|---|---|---|
| JP | 05-198943 | 8/1993 |
| JP | 05-299815 | 11/1993 |
| JP | 09-275254 | 10/1997 |
| JP | 10-308567 | 11/1998 |
| JP | 2000-285218 | 10/2000 |
| JP | 2007-027296 | 2/2007 |

OTHER PUBLICATIONS

Supplementary European Search Report issued in Application No. 15829191.4, dated Feb. 6, 2018.
International Search Report, PCT/JP2015/072147, dated Oct. 20, 2015.

* cited by examiner (a)

(b)

(c)

(a)

(b)

(c)

(a)

(b)

(c)

METHOD FOR MANUFACTURING WIRING CIRCUIT COMPONENT, MOLD FOR MANUFACTURING WIRING CIRCUIT COMPONENT, AND RESINOUS WIRING CIRCUIT COMPONENT

TECHNICAL FIELD

This invention relates to a method for manufacturing a wiring circuit component, and a mold for manufacturing a wiring circuit component. The present invention also relates to a wiring circuit component made of resin.

BACKGROUND ART

In electronic equipment and IC cards, a printed circuit board for wiring is used. Electronic equipment and IC cards exposed to harsh usage environments are often used in environments or circumstances where the printed circuit boards are apt to be damaged, or where wiring is susceptible to breakage. It has so far been common practice, therefore, to cover printed circuit boards, etc. with resin materials, thereby enhancing resistance to damage or wire breakage (see, for example, Patent Document 1).

According to the prior art, however, processing for covering a printed circuit board, which is mounted with an IC chip, with a resin has been required, and it has been necessary to select a resin suitable for processing and capable of enhancing resistance against damage or wire breakage. Thus, the fact has been that a member having a printed circuit board with enhanced resistance to damage or wire breakage takes a lot of time and effort to produce, and involves a high cost.

Under these circumstances, studies have been conducted on the possibility of manufacturing a resinous wiring circuit component by shaping a board member serving as a base and an anti-magnetic member, and further shaping a wirable resin in the board member.

PRIOR ART DOCUMENTS

Patent Documents

Patent Document 1: JP-A-2000-285218

SUMMARY OF THE INVENTION

Problems to be Solved by the Invention

The present invention has been accomplished in light of the above circumstances. It is an object of the invention to provide a manufacturing method capable of manufacturing a wiring circuit component in which a wirable resin has been shaped in a board member.

The present invention has been accomplished in light of the above circumstances. It is another object of the invention to provide a mold capable of manufacturing a wiring circuit component in which a wirable resin has been shaped in a board member.

The present invention has been accomplished in light of the above circumstances. It is still another object of the invention to provide a resinous wiring circuit component in which wiring has been shaped in a resinous board member with the use of a wirable resin.

Means for Solving the Problems

The present applicant has found that a wiring component having an ultrathin wiring site shaped therein can be manufactured by a resin shaping method which comprises preparing a mold for shaping a fine member, and shaping a substrate member serving as an anti-magnetic body, and a wirable resin, by use of an engraving technology, a mold making technology, and a two-color formation technology in the possession of the present applicant. Based on this finding, the present applicant has accomplished the present invention.

A method for manufacturing a wiring circuit component, according to a first aspect of the present invention for attaining the above object, comprises: shaping a board section made of a non-conductive resin so as to form in one surface thereof a one-surface groove for wiring, form in an opposite surface thereof opposite-surface grooves for wiring by protruding core members from a molding surface, and form communication parts for connecting the one-surface groove and the opposite-surface grooves together; and retracting the core members from the molding surface, and then supplying a conduction-side resin, which will become conductive, to the board section, thereby shaping the conduction-side resin, which will become conductive, in the one-surface groove, the opposite-surface grooves, and the communication parts.

With the present invention according to the first aspect, the resinous wiring circuit component provided with wirings made of the conduction-side resin, which will become conductive, on the one surface (front surface) and the opposite surface (back surface), and having the wiring on the one surface and the wirings on the opposite surface connected by the communication parts is shaped by two-color shaping associated with the protrusion and retraction of the core members.

As a result, it becomes possible to obtain the wiring circuit component having the wirable resin shaped in the board member.

A mold for manufacturing a wiring circuit component, according to a second aspect of the present invention for attaining another of the objects, comprises: a first fixed mold and a second fixed mold on a fixed side, and a movable mold on a movable side, wherein the movable mold has protrusible and retractable opposite-surface projections provided on a surface thereof opposing the first fixed mold or the second fixed mold; the first fixed mold has a one-surface projection and communication pins provided on a surface thereof opposing the movable mold, while the second fixed mold has a planar site provided on a surface thereof opposing the movable mold; the first fixed mold is equipped with a first resin supply portion which, when the first fixed mold and the movable mold are mold-clamped, with the opposite-surface projections of the movable mold protruding, supplies a non-conductive resin to a space part to shape a board section having a one-surface groove at a site of the one-surface projection, communication parts at sites of the communication pins, and opposite-surface grooves at sites of the opposite-surface projections; and the second fixed mold is equipped with a second resin supply portion which, when the second fixed mold and the movable mold are mold-clamped, with the opposite-surface projections of the movable mold being retracted, while the shaped board section is being mounted on the movable mold, supplies a conduction-side resin, which will become conductive, to the one-surface groove, the opposite-surface grooves, and the communication parts of the board section to shape a wiring portion.

With the present invention according to the second aspect, the first fixed mold and the movable mold are mold-clamped, with the opposite-surface projections (back projections) of the movable mold protruding, and the nonconductive resin is supplied from the first resin supply portion to the space part to shape the board section having the one-surface groove (front groove) at the site of the one-surface projection (front projection), the communication holes at the sites of the communication pins, and the opposite-surface grooves (back grooves) at the sites of the back projections. In this manner, primary shaping is performed. The back projections of the movable mold are retracted, with the board section as the primary shaping product being mounted on the movable mold, and the second fixed mold and the movable mold are mold-clamped. The conduction-side resin, which will become conductive, is supplied from the second resin supply portion to the front groove, the communication holes, and the back grooves, thereby shaping wirings of the conduction-side resin, which will become conductive, in the front groove and the back grooves communicating with each other via the communication holes of the board section. In this manner, secondary shaping is performed.

As a result, it becomes possible to obtain the wiring circuit component having the wirable resin shaped in the board member.

A mold for manufacturing a wiring circuit component, according to a third aspect of the present invention, is the mold for manufacturing a wiring circuit component according to the second aspect, wherein a plurality of types of the opposite-surface projections are provided, and fixed to a common plate; the plate is supported reciprocatably by the movable mold; the plate reciprocatingly moves to enable the opposite-surface projections to be protruded and retracted at the surface opposing the second fixed mold; the movable mold is equipped with tilt members for reciprocating the plate; the tilt members tilt to one side to move the plate so as to protrude the opposite-surface projections, and tilt to an opposite side to move the plate so as to retract the opposite-surface projections; the first fixed mold is equipped with first push pins for tilting the tilt members to the one side for positional regulation when mold-clamped in cooperation with the movable mold; and the second fixed mold is equipped with second push pins for tilting the tilt members to the one side via the plate for positional regulation when mold-clamped in cooperation with the movable mold.

According to the third aspect of the invention, upon the tilting motions of the tilt members to the one side and the opposite side, the plural types of the back projections are protruded and retracted in unison via the plate. When the first fixed mold and the movable mold are mold-clamped, the tilt members are tilted by the first push pins to the one side for regulation, and the plural types of back projections are protruded in unison via the plate. When the second fixed mold and the movable mold are mold-clamped, the tilt members are tilted by the second push pins to the opposite side for regulation, and the plural types of back projections are retracted in unison via the plate. Consequently, during primary shaping for shaping the board section, the plural types of back projections are brought into a state of protrusion in unison by mold clamping. During secondary shaping for shaping the conduction-side resin, which will become conductive, the plural types of back projections are maintained in the state of retraction in unison by mold clamping.

A mold for manufacturing a wiring circuit component, according to a fourth aspect of the present invention, is the mold for manufacturing a wiring circuit component according to the second or third aspect, wherein the non-conductive resin supplied from the first resin supply portion is ABS resin serving as an anti-magnetic body, and the conduction-side resin, which will become conductive, supplied from the second resin supply portion is polycarbonate which can be coated with a metal by plating.

According to the fourth aspect of the invention, the board section having the polycarbonate shaped in the communication holes, the one-surface groove (front groove), and the opposite-surface grooves (back grooves) is plated, whereby only the polycarbonate site is coated with the metal to form wirings. The conduction-side resin which will become conductive may be resin having conductivity as a result of incorporation of the metal into the resin itself, and this resin can be made into wirings by direct shaping.

A resinous wiring circuit component, according to a fifth aspect of the present invention for attaining another of the objects, comprises: a board section made of a non-conductive resin; wiring on a one-surface side provided on one surface of the board section and made of a conduction-side resin which will become conductive; wirings on an opposite-surface side provided on an opposite surface of the board section and made of the conduction-side resin which will become conductive; and wirings in communication parts made of the conduction-side resin and connecting the wiring on the one-surface side and the wirings on the opposite-surface side together.

According to the fifth aspect of the invention, there is provides the resinous wiring circuit component having wirings shaped from the wirable resin in the board member made of resin.

Effects of the Invention

The manufacturing method for a wiring circuit component according to the present invention can provide a wiring circuit component in which a wirable resin has been shaped in a board member.

The mold capable of manufacturing a wiring circuit component according to the present invention makes it possible to shape a wiring circuit component in which a wirable resin has been shaped in a board member.

The resinous wiring circuit component of the present invention provides a resinous wiring circuit component in which wirings have been shaped in a resinous board member with the use of a wirable resin.

MODE FOR CARRYING OUT THE INVENTION

Figure 1:
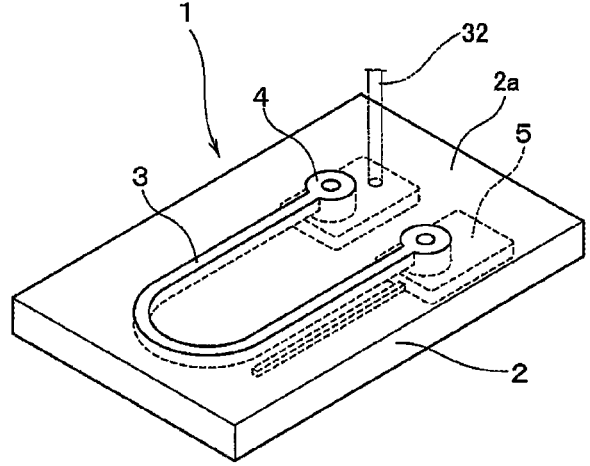
FIGS. 1(a) to 1(c) are structure explanation drawings of a wiring circuit component.
Figure 1:
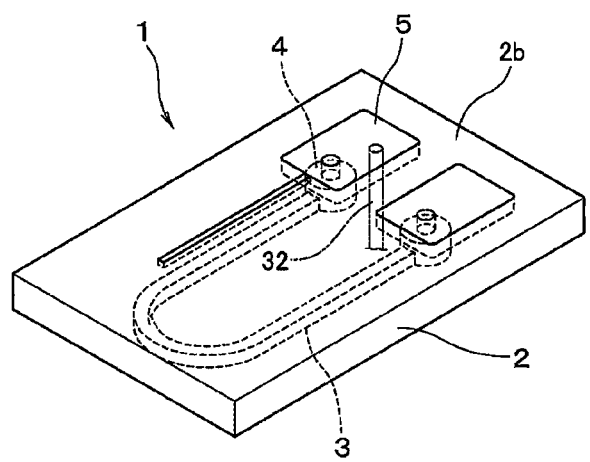
Figure 1:
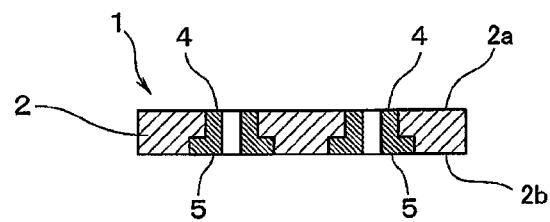

A wiring circuit component (resinous wiring circuit component) to be shaped by a mold according to an embodiment of the present invention will be described based on FIGS. 1(a) to 1(c).

FIGS. 1(a) to 1(c) show the structure of the wiring circuit component, FIG. 1(a) being an external view showing one surface (front surface) of the wiring circuit component, FIG. 1(b) being an external view showing an opposite surface (back surface) of the wiring circuit component, and FIG. 1(c) being a sectional view of the wiring circuit component.

As shown in FIG. 1(a), a wiring circuit component 1 has a plate-shaped board section 2 shaped by molding from ABS resin as a non-conductive resin serving as an anti-magnetic body. On one surface (front surface) 2a of the board section 2, polycarbonate is shaped in a one-surface groove (e.g., a 1 mm wide groove) by molding as a conduction-side resin which will become conductive.

As shown in FIG. 1(b), polycarbonate is shaped in opposite-surface grooves (e.g., a rectangular groove, and a groove comprising a rectangular groove and a narrow groove continuous therewith) by molding on an opposite surface (back surface) 2b of the board section 2 as a conduction-side resin which will become conductive.

As shown in FIGS. 1(a) to 1(c), between the one-surface groove and the opposite-surface grooves of the board section 2, tubular communication parts connecting the one-surface groove and the opposite-surface grooves together are formed, and polycarbonate is shaped in the communication parts by molding as a conduction-side resin which will become conductive.

After the resin is shaped in the one-surface groove, the opposite-surface grooves, and the communication parts, the board section 2 is plated, whereby the polycarbonate at the sites of the one-surface groove, the opposite-surface grooves, and the communication parts is coated with a metal. As a result, front-side wiring 3, communication wirings 4, and back-side wirings 5 as a wiring portion (wiring on the one-surface side, wirings in the communication parts, and wirings on the opposite-surface side) rendered conductive are formed continuously to range from the front surface 2a to the back surface 2b of the board section 2.

A mold for shaping the wiring circuit component 1 will be described based on FIGS. 2 to 6(a), 6(b).

Figure 2:
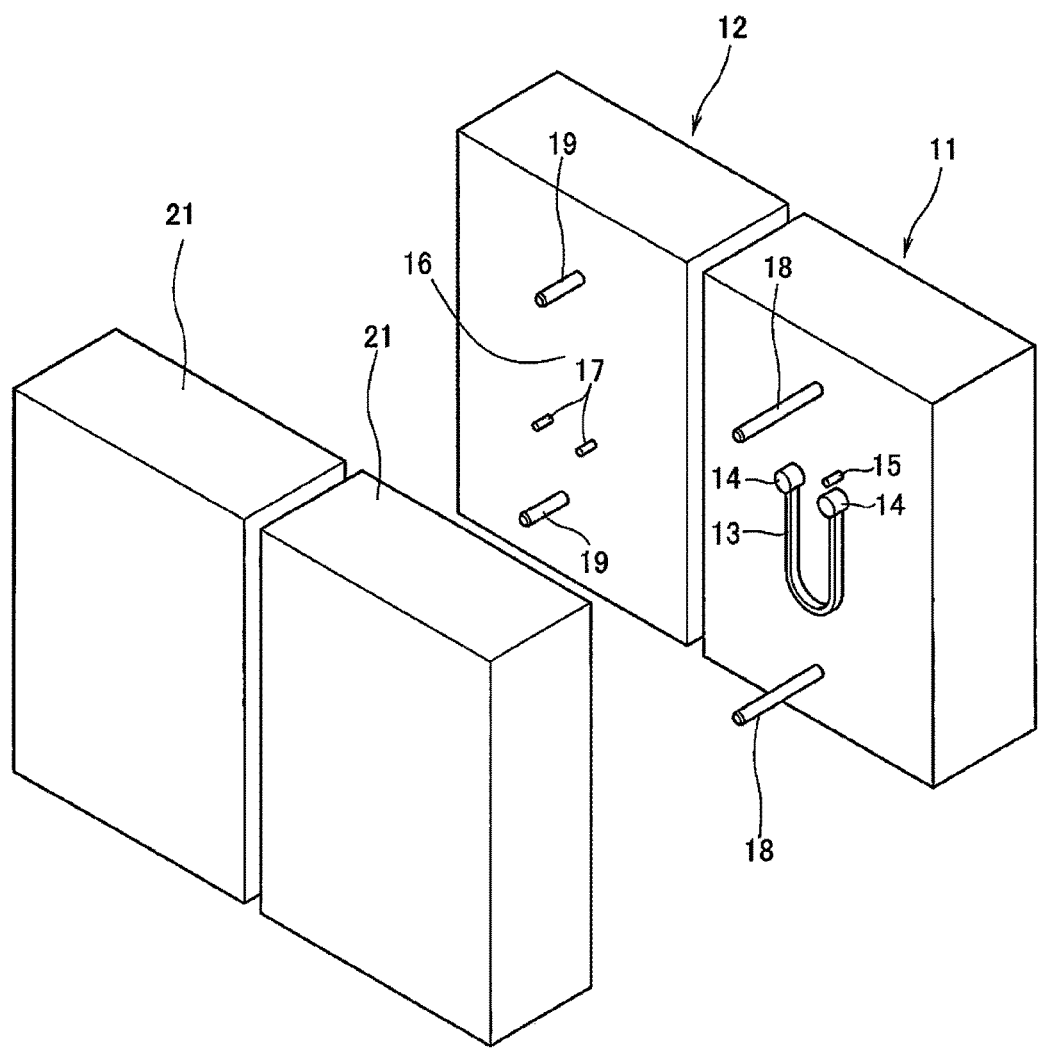
FIG. 2 is an external view of essential parts of a mold according to an embodiment of the present invention.
Figure 3:
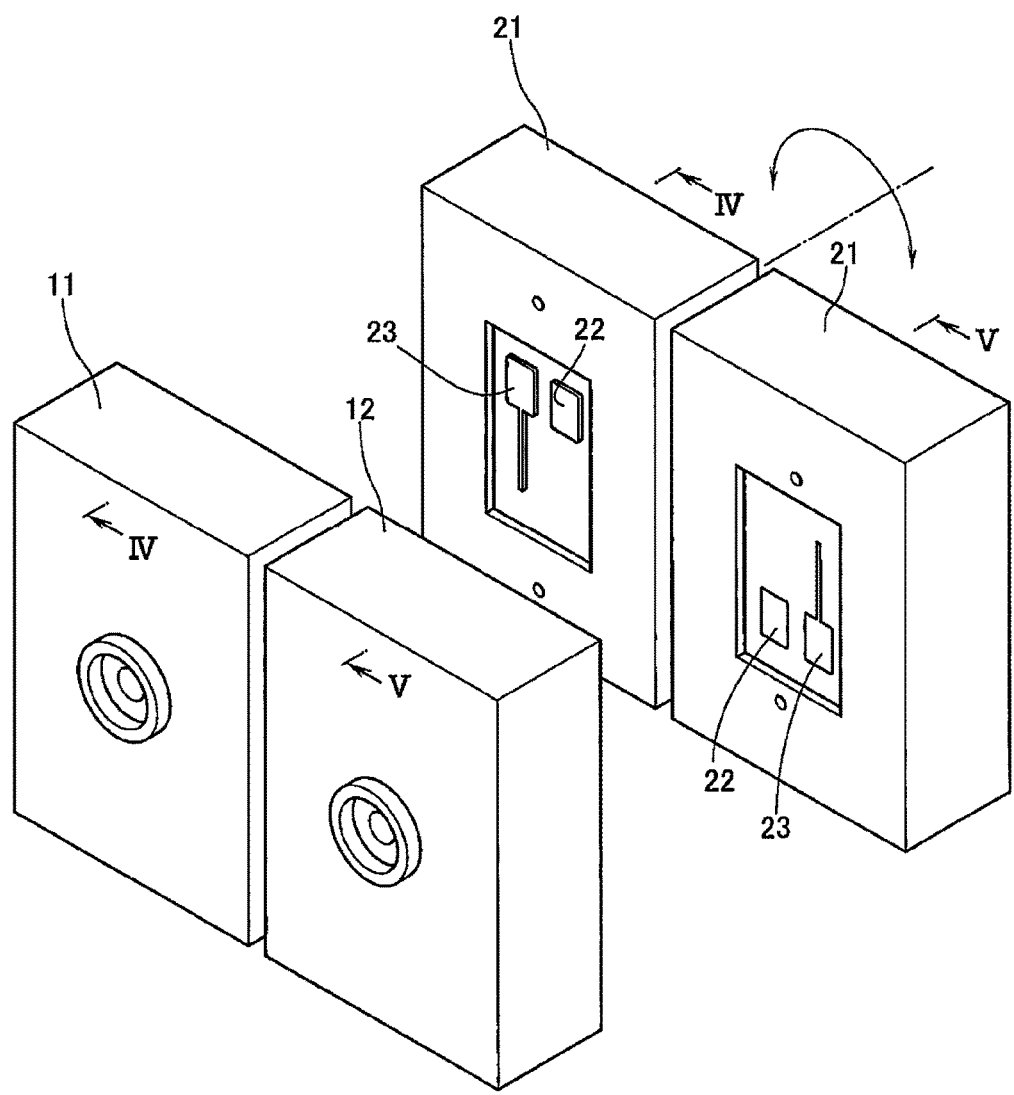
FIG. 3 is an external view of the essential parts of the mold according to the embodiment of the present invention.
Figure 4:
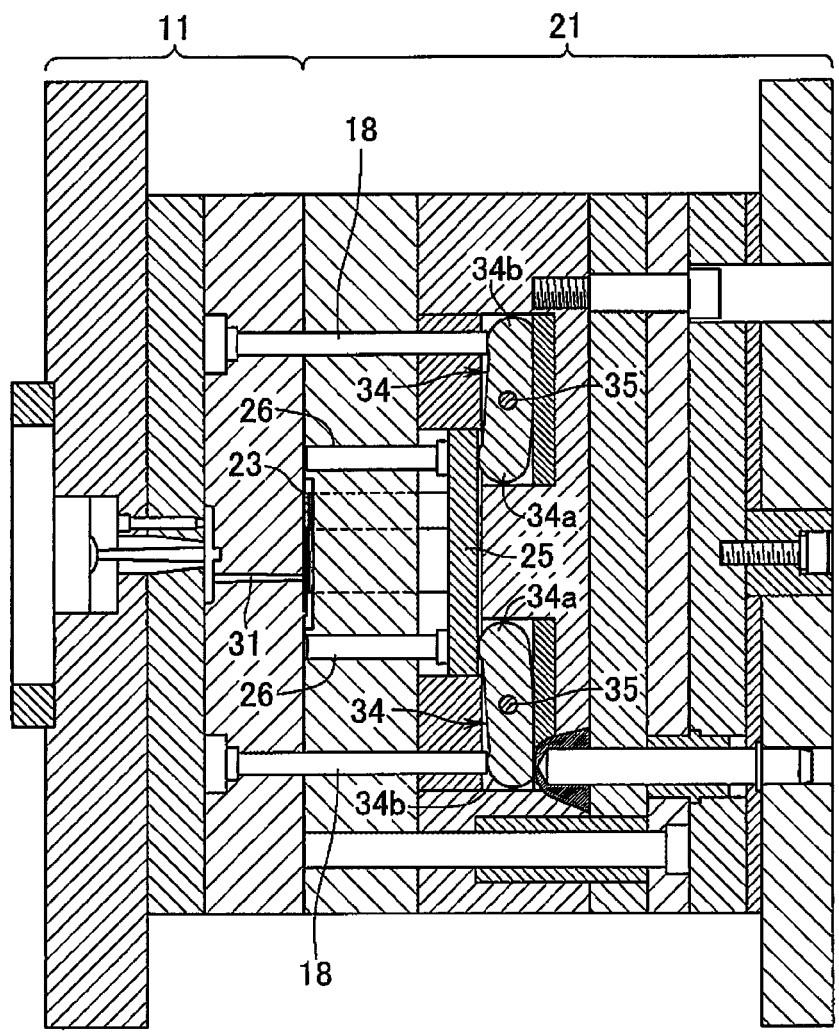
FIG. 4 is a view taken along line IV-IV in FIG. 3, as viewed in the direction of the appended arrows.
Figure 5:
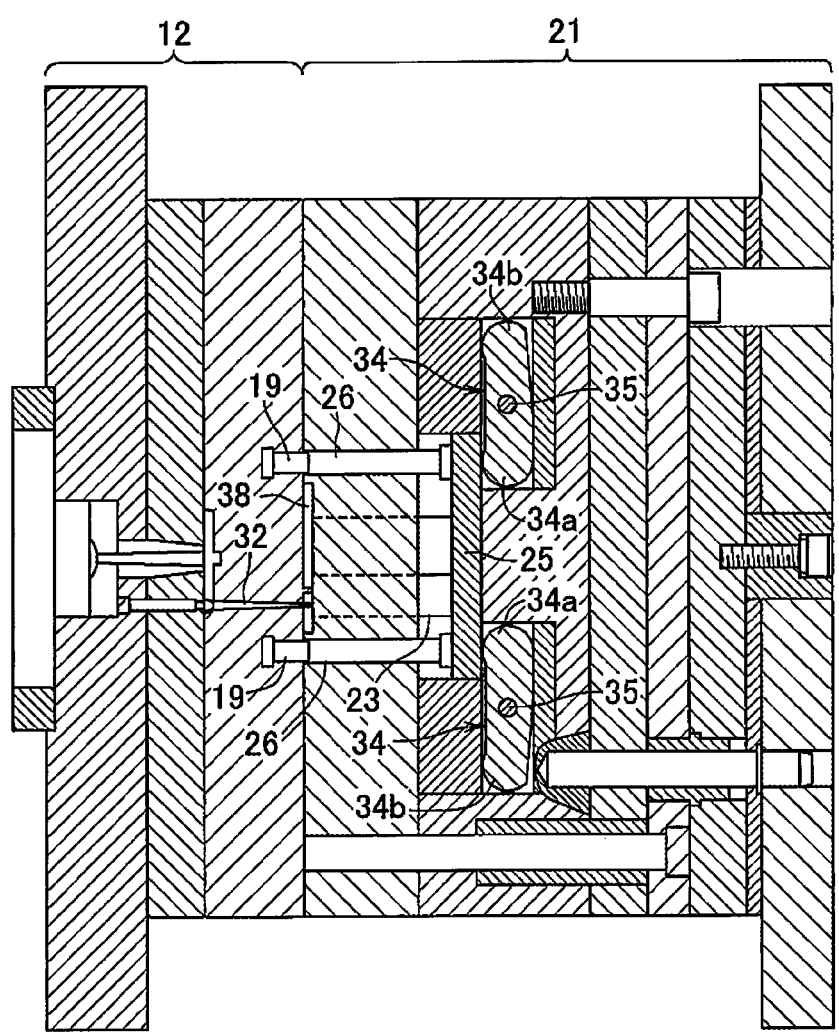
FIG. 5 is a view taken along line V-V in FIG. 3, as viewed in the direction of the appended arrows.
Figure 6:
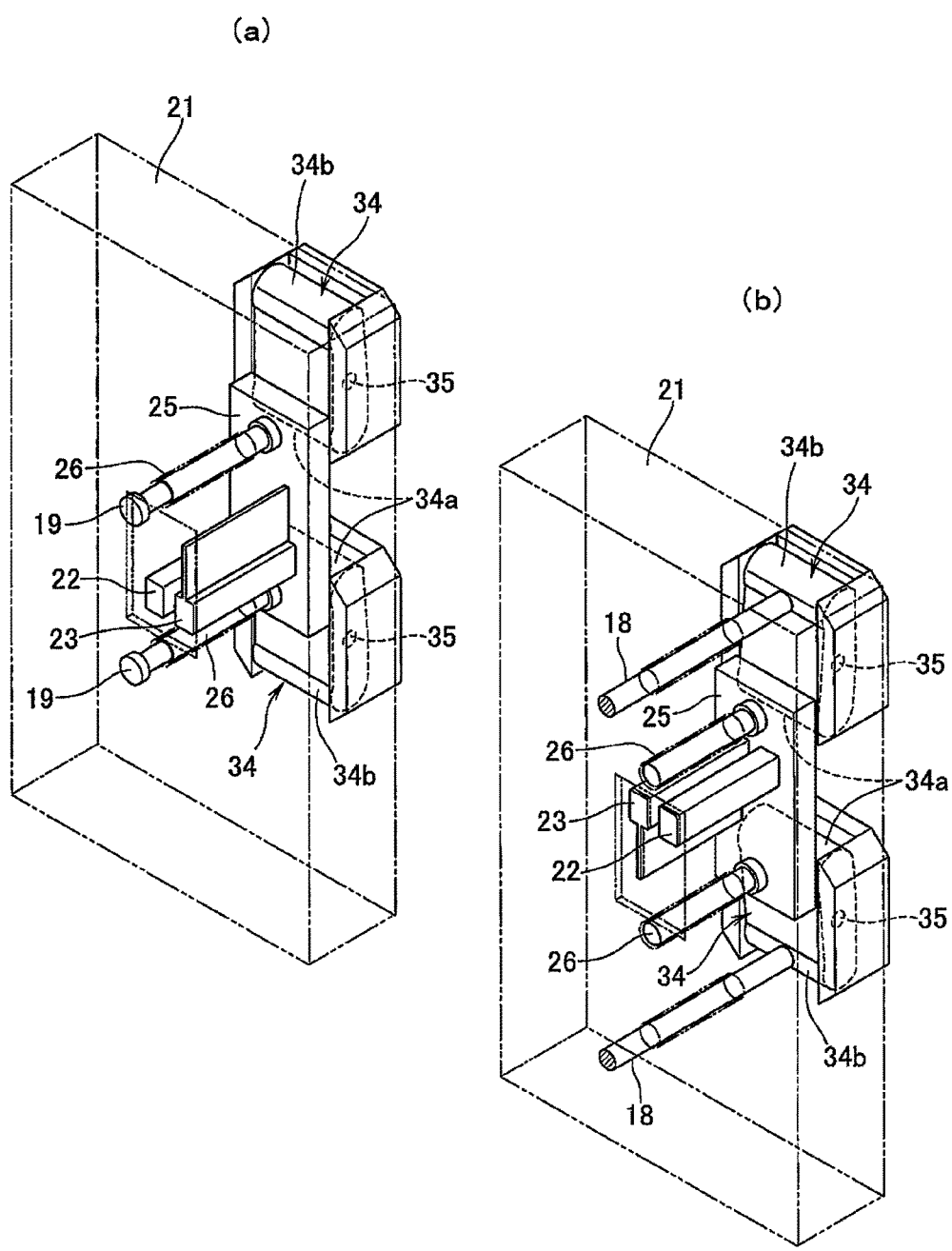
FIGS. 6(a), 6(b) are external views of a tilt member.

FIG. 2 is an external view of essential parts showing the mold surfaces of fixed-side molds of the mold according to an embodiment of the present invention. FIG. 3 is an external view of essential parts showing the mold surfaces of movable-side molds of the mold according to the embodiment of the present invention. FIG. 4 is a view taken along line IV-IV in FIG. 3, as viewed in the direction of the appended arrows, showing the shaping status on the primary side (mold-clamped state in the shaping status of the board section). FIG. 5 is a view taken along line V-V in FIG. 3, as viewed in the direction of the appended arrows, showing the shaping status on the secondary side (mold-clamped state in the shaping status of the wiring portion).

FIGS. 6(a), 6(b) show the appearance of a tilt member, FIG. 6(a) showing a state in which opposite-surface projections as core members are protruded, and FIG. 6(b) showing a state in which the opposite-surface projections as the core members are retracted.

As shown in FIG. 2, a first fixed mold 11 for performing primary-side shaping (shaping of the board section), and a second fixed mold 12 for performing secondary-side shaping (shaping of the wiring portion) are provided as fixed-side molds.

In the first fixed mold 11, a grooving projection 13 for forming the one-surface groove (front-side wiring 3, see FIGS. 1(a) to 1(c)) in the board section 2 (see FIGS. 1(a) to 1(c)) is provided, as a one-surface projection, on a surface thereof opposing a movable mold 21 (primary side). In addition to the one-surface projection, communication pins 14 are provided for forming the communication parts (communication wirings 4, see FIGS. 1(a) to 1(c)) in the board section 2 (see FIG. 1). The numeral 15 in the drawing denotes a pin for forming a hole for supplying resin to the back-side wirings to be described later.

In the second fixed mold 12, a planar site 16 for forming a cavity is provided in a surface thereof opposing a movable mold 21 (secondary side). Center pins 17 for forming the centers of the tubular communication parts are provided on the surface of the second fixed mold 12 which opposes the movable mold 21 (secondary side).

In the first fixed mold 11, moreover, first push pins 18 for operating tilt members (to be described later) are provided on the surface thereof opposing the movable mold 21 (primary side). In the second fixed mold 11, second push pins 19 for operating the tilt members (to be described later) are provided on the surface thereof opposing the movable mold 21 (secondary side).

As shown in FIG. 3, two of the movable molds 21 are provided as movable-side molds. In the movable molds 21, core members 22, 23 for forming the opposite-surface grooves (back-side wirings 5, see FIGS. 1(a) to 1(c)) in the board section 2 (see FIGS. 1(a) to 1(c)) are provided, as opposite-surface projections, on surfaces thereof opposing the first fixed mold 11 and the second fixed mold 12. The core members 22, 23 are long members whose cross-sectional shapes are the shapes of the opposite-surface grooves. The opposite-surface grooves include, for example, a rectangular groove, and a groove comprising a rectangular groove and a narrow groove continuous therewith. Thus, the cross-sectional shape of the core member 22 is made a shape corresponding to the rectangular groove, while the cross-sectional shape of the core member 23 is made a shape corresponding to the groove comprising a rectangular groove and a narrow groove continuous therewith.

The core members 22, 23 of the movable mold 21 opposing the first fixed mold 11 are maintained in a state protruding from the mold surface during mold clamping. The core members 22, 23 of the movable mold 21 reversed and opposed to the second fixed mold 12 are maintained in a retracted state so as to be flush with the mold surface when the molds are clamped. The positions of protrusion and retraction of the core members 22, 23 are maintained by the operation of the tilt members (to be described later) by the first push pins 18 and the second push pins 19 during mold clamping.

As shown in FIG. 4, the first fixed mold 11 is provided with a first resin flow path 31 as a first resin supply portion for supplying ABS resin, as a non-conductive resin, to a cavity part (space part) when the core members 22, 23 are protruded upon operation of the tilt members by the first push pins 18 during mold clamping.

By supply ABS resin from the first resin flow path 31 to the cavity where the core members 22, 23 protrude, there is formed the board section 2 having the one-surface groove at the site of the grooving projection 13 (see FIG. 2), the communication parts at the sites of the communication pins 14 (see FIG. 2), and the opposite-surface grooves at the sites of the core members 22, 23.

As shown in FIG. 5, the second fixed mold 12 is provided with a second resin flow path 32 as a second resin supply portion for supplying polycarbonate, as a conduction-side resin, to the cavity part (space part) when the core members 22, 23 are retracted so as to become flush with the mold surface, upon operation of the tilt members by the second push pins 19 during mold clamping.

By supply polycarbonate from the second resin flow path 32 to the cavity where the core members 22, 23 retract, a conductive resin, which will become capable of conducting electricity (capable of being coated with a metal by plating), is supplied to the one-surface groove, communication parts, and opposite-surface grooves of the board section 2, whereby the front-side wiring 3 (see FIGS. 1(a), 1(b)), the communication wirings 4 (see FIGS. 1(a) to 1(c)), and the back-side wirings 5 (see FIGS. 1(a) to 1(c)) are shaped.

Based on FIGS. 4 to 6(a), 6(b), the configurations of the core members 22, 23 and the tilt member will be described concretely.

The movable mold 21 is provided with the long core members 22, 23 as the opposite-surface projections, and the base ends of the core members 22, 23 are attached to the surface of one (common) plate 25. The plate 25 is supported by the movable mold 21 so as to be reciprocatable in the left/right direction in the drawings and, when the plate 25 reciprocates, the core members 22, 23 are protruded and retracted with respect to the mold surface.

In the movable mold 21 on the rear side of the plate 25, tilt pieces 34 as tilt members are supported by tilt pins 35 so as to be tiltable. The tilt pieces 34 are provided in FIGS. 4 and 5 above and below the plate 25, with the plate 25 being interposed therebetween. One end 34a of the tilt piece 34 abuts on the back surface of the plate 25 and, as shown in FIGS. 4 and 6(a), 6(b), the other end 34b of the tilt piece 34 opposes the position of the leading end of the first push pin 18 of the first fixed mold 11.

That is, when the movable mold 21 and the first fixed mold 11 are mold-clamped, the first push pin 18 is inserted into the movable mold 21, and the other end 34b of the tilt piece 34 is pushed, whereupon the back surface of the plate 25 is pushed by the one end 34a of the tilt piece 34. As a result, the moving position of the plate 25 is restricted to a state where the core members 22, 23 protrude (see FIG. 6(b)).

On the other hand, an operating pin 26 is attached to the front surface of the plate 25 corresponding to the one end 34a of the tilt piece 34 and, as shown in FIGS. 5 and 6(a), 6(b), the leading end of the operating pin 26 opposes the position of the leading end of the second push pin 19 of the second fixed mold 12.

That is, when the movable mold 21 and the second fixed mold 12 are mold-clamped, the second push pin 19 is inserted into the movable mold 21, and the plate 25 is pushed via the operating pin 26 in a direction in which the core members 22, 23 retract (in the rightward direction in the drawings). Thus, the one end 34a of the tilt piece 34 is pushed to tilt the tilt piece 34. As a result, the moving position of the plate 25 is restricted to a state where the core members 22, 23 retract (see FIG. 6(a)).

The process of shaping the wiring circuit component 1 will be described based on FIGS. 7(a) to 7(c) and 8(a) to 8(c).

Figure 7:
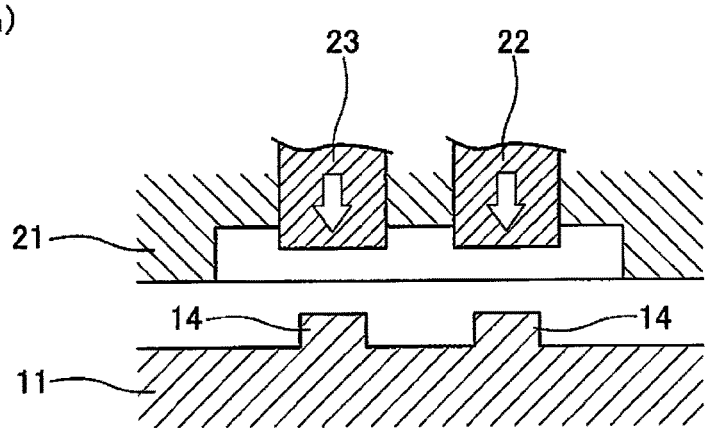
FIGS. 7(a) to 7(c) are process explanation drawings of primary shaping (shaping of a board section).
Figure 7:
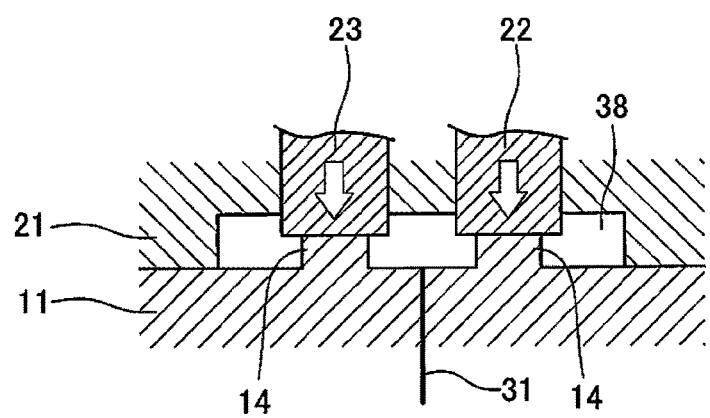
Figure 7:
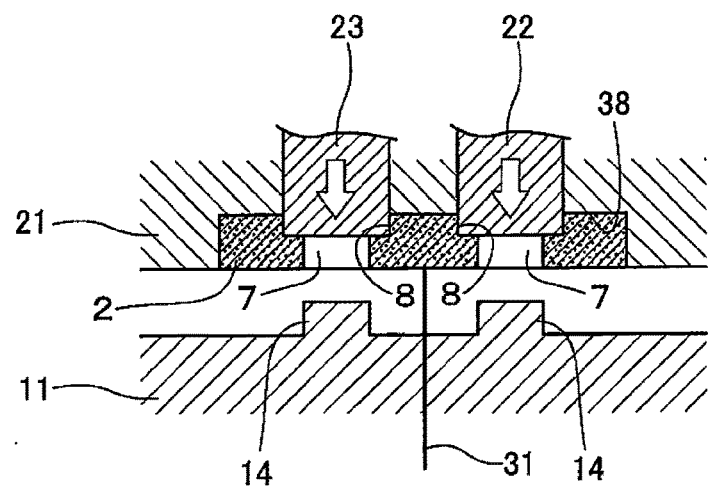
Figure 8:
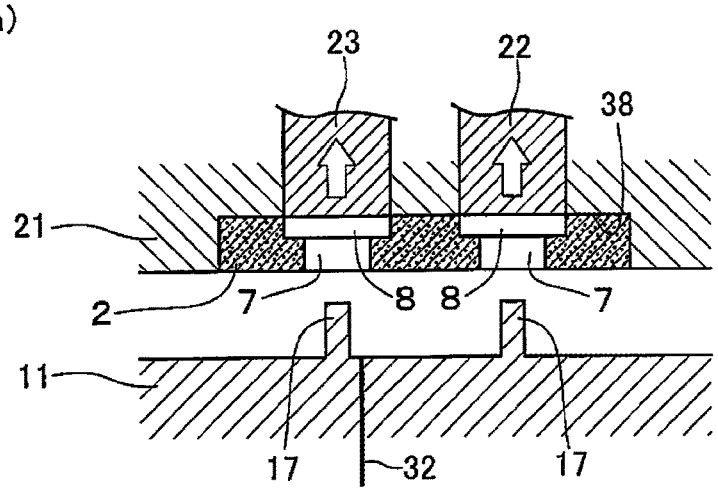
FIGS. 8(a) to 8(c) are process explanation drawings of secondary shaping (shaping of a wiring portion).
Figure 8:
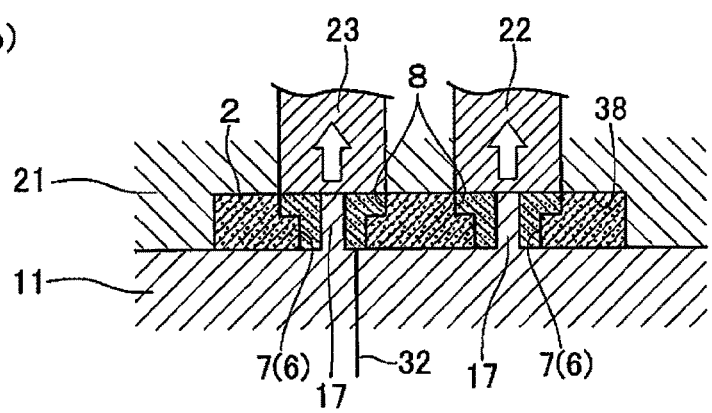
Figure 8:
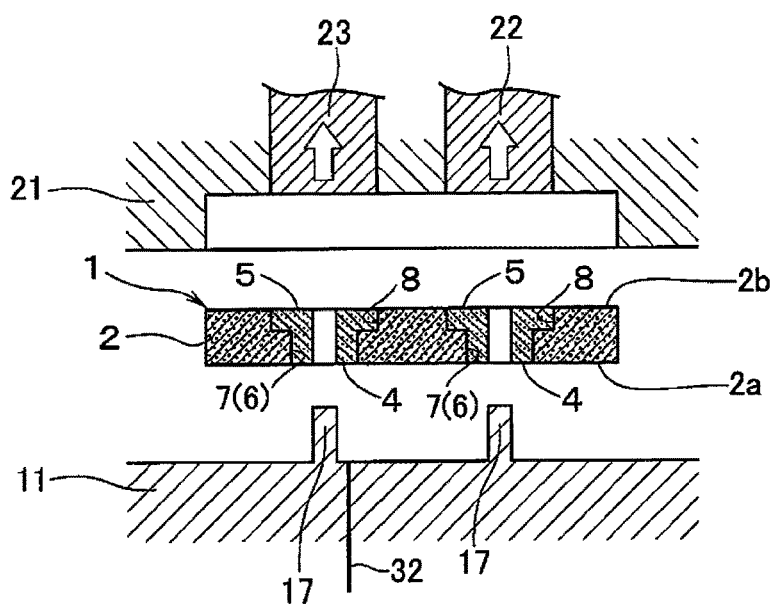

FIGS. 7(a) to 7(c) show a process status illustrating the shaping of the board section 2 which is primary shaping. FIGS. 8(a) to 8(c) show a process status in which shaping of the wiring portion as secondary shaping is being performed for the board section. In these drawings, FIGS. 7(a), 8(a) represent the status before mold clamping, FIGS. 7(b), 8(b) represent the status during mold clamping, and FIGS. 7(c), 8(c) represent the status after mold opening.

As shown in FIG. 7(a), when the board section 2 is to be shaped, the movable mold 21 and the first fixed mold 11 are opposed to each other. At the sites in the cross section where the communication wirings 4 (see FIGS. 1(a) to 1(c)) and the back-side wirings 5 (see FIGS. 1(a) to 1(c)) are present, the core member 22 (23) and the communication pin 14 are opposed to each other, with the core member 22 (23) protruding.

As shown in FIG. 7(b), when the movable mold 21 moves toward the first fixed mold 11 and the molds are clamped, the core member 22 (23) contacts the communication pin 14, whereby a cavity (space) 38 is formed between the mold surfaces of the movable mold 21 and the first fixed mold 11. ABS resin is supplied from the first resin flow path 31 to the cavity 38 where the core member 22 (23) is protruding.

When the movable mold 21 and the first fixed mold 11 are mold-clamped, as shown in FIG. 4 and FIG. 7(b), the other end 34b of the tilt piece 34 is pushed by the first push pin 18, whereby the back surface of the plate 25 is pushed by the one end 34a of the tilt piece 34, so that the protruding position of the core member 22 (23) is regulated to maintain the state of protrusion.

When the movable mold 21 is separated from the first fixed mold 11 for mold opening, as shown in FIG. 7(c), the board section 2 having a one-surface groove 6 at the site of the grooving projection 13 (see FIG. 2), communication parts 7 at the sites of the communication pins 14, and opposite-surface grooves 8 at the site of the core member 22 (23) are formed, and the board section 2 is held on the side of the movable mold 21.

The first fixed mold 11 and the second fixed mold 12 are turned integrally, whereupon the movable mold 21 holding the board section 2 opposes the second fixed mold 12, and the movable mold 21 from which the shaped wiring circuit component 1 has been withdrawn opposes the first fixed mold 11.

As shown in FIG. 8(a), the movable mold 21 holding the board section 2 opposes the second fixed mold 12, and the center pins 17 oppose the sites of the communication parts 7 of the board section 2.

As shown in FIG. 8(b), when the movable mold 21 moves toward the second fixed mold 12 for mold clamping, the center pins 17 are inserted into the communication parts 7 of the board section 2. As shown in FIGS. 5 and 8(a) to 8(c), the operating pins 26 are pushed by the second push pins 19, whereby the plate 25 is pushed. As a result, the tilt pieces 34 are tilted, and the retraction position of the core member 22 (23) is regulated to maintain the retracted state.

Polycarbonate is supplied from the second resin flow path 32 to the opposite-surface groove 8, with the core member 22 (23) being retracted, and polycarbonate is also supplied to the tubular communication part 7 (one-surface groove 6). Thus, the polycarbonate as a conduction-side resin is shaped in the communication parts 7 (one-surface groove 6) and the opposite-surface grooves 8 of the board section 2.

As shown in FIG. 8(c), when the movable mold 21 is separated from the second fixed mold 12 for mold opening, the board section 2 having a wiring resin shaped in the one-surface groove 6, the tubular communication parts 7, and the opposite-surface grooves 8 is shaped. The board section 2 with the wiring resin shaped is detached from the movable mold 21 by push-out members (not shown).

The board section 2 with the shaped resin has the wiring resin coated with a metal by plating or the like, and is thereby turned into the wiring circuit component 1, as a resinous molded product, in which the front-side wiring 3 (see FIGS. 1(a), 1(b)), communication wirings 4 (see FIGS. 1(a) to 1(c)), and back-side wirings 5 (see FIGS. 1(a) to 1(c)) have been shaped.

As described above, in the shaping of the board section 2 which is primary shaping, molding of ABS resin being a non-conductive resin forms the one-surface groove 6 for wiring on the surface of the board section 2, and the core member 22 (23) is protruded from the molding surface to form the opposite-surface grooves 8 for wiring on the back surface of the board section 2. Furthermore, the communication parts 7 for connecting the one-surface groove 6 and the opposite-surface grooves 8 are formed in the board section 2.

In the shaping of the wiring portion which is secondary shaping for the board section 2, the core member 22 (23) is retracted from the molding surface. Then, polycarbonate as the conduction-side resin is shaped in the one-surface grooves 6, communication parts 7, and the opposite-surface grooves 8 of the board section 2. The outcome is the wiring circuit component 1 as the resin molded product in which the front-side wiring 3 (see FIGS. 1(*a*), 1(*b*)), communication wirings 4 (see FIGS. 1(*a*) to 1(*c*)), and back-side wirings 5 (see FIGS. 1(*a*) to 1(*c*)) have been formed.

Consequently, it becomes possible to obtain the wiring circuit component 1 in which polycarbonate capable of realizing wirings connecting the front and back surfaces has been shaped in the board section 2 being the board member. Thus, the board section 2 serving as a base and an anti-magnetic body is shaped using resin, and resin capable of wiring is shaped in the wiring grooves of the board section 2, whereby the resinous wiring circuit component 1 can be manufactured very easily and inexpensively in large amounts.

INDUSTRIAL APPLICABILITY

The present invention can be utilized in industrial fields concerned with a method for manufacturing a wiring circuit component, a mold for manufacturing a wiring circuit component, and a resinous wiring circuit component shaped from resin.

EXPLANATIONS OF LETTERS OR NUMERALS

1 Wiring circuit component
2 Board section
3 Front-side wiring
4 Communication wiring
5 Back-side wiring
6 One-surface groove
7 Communication part
8 Opposite-surface groove
11 First fixed mold
12 Second fixed mold
13 Grooving projection
14 Communication pin
15 Pin
16 Planar site
17 Center pin
18 First push pin
19 Second push pin
21 Movable mold
22, 23 Core member
25 Plate
26 Operating pin
31 First resin flow path
32 Second resin flow path
34 Tilt piece

The invention claimed is:

1. A mold for manufacturing a wiring circuit component, the mold comprising:
a first fixed mold and a second fixed mold on a fixed side; and
a movable mold on a movable side,
wherein the movable mold has protrusible and retractable opposite-surface projections provided on a surface thereof opposing the first fixed mold or the second fixed mold,
the first fixed mold has a one-surface projection and communication pins provided on a surface thereof opposing the movable mold, while the second fixed mold has a planar site provided on a surface thereof opposing the movable mold,
the first fixed mold is equipped with a first resin supply portion which, when the first fixed mold and the movable mold are mold-clamped, with the opposite-surface projections of the movable mold protruding, supplies a non-conductive resin to a space part to shape a board section having a one-surface groove at a site of the one-surface projection, communication parts at sites of the communication pins, and opposite-surface grooves at sites of the opposite-surface projections,
the second fixed mold is equipped with a second resin supply portion which, when the second fixed mold and the movable mold are mold-clamped, with the opposite-surface projections of the movable mold being retracted, while the shaped board section is being mounted on the movable mold, supplies a conduction-side resin, which will become conductive, to the one-surface groove, the opposite-surface grooves, and the communication parts of the board section to shape a wiring portion
a plurality of types of the opposite-surface projections are provided, and fixed to a common plate,
the common plate is supported reciprocatably by the movable mold,
the common plate reciprocatingly moves to enable the opposite-surface projections to be protruded and retracted at the surface opposing the second fixed mold,
the movable mold is equipped with tilt members for reciprocating the common plate,
the tilt members tilt to one side to move the common plate to protrude the opposite-surface projections, and tilt to an opposite side to move the common plate to retract the opposite-surface projections,
the first fixed mold is equipped with first push pins configured to tilt the tilt members to the one side for positional regulation when mold-clamped in cooperation with the movable mold, and
the second fixed mold is equipped with second push pins configured to tilt the tilt members to the one side via the common plate for positional regulation when mold-clamped in cooperation with the movable mold.

2. The mold for manufacturing a wiring circuit component according to claim 1, wherein
the non-conductive resin supplied from the first resin supply portion is ABS resin serving as an anti-magnetic body, and
the conduction-side resin, which will become conductive, supplied from the second resin supply portion is polycarbonate which can be coated with a metal by plating.

* * * * *